United States Patent
Gejo

(10) Patent No.: US 10,727,225 B2
(45) Date of Patent: Jul. 28, 2020

(54) IGBT SEMICONDUCTOR DEVICE

(71) Applicants: Kabushiki Kaisha Toshiba, Minato-ku (JP); Toshiba Electronic Devices & Storage Corporation, Minato-ku (JP)

(72) Inventor: Ryohei Gejo, Kanazawa (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 109 days.

(21) Appl. No.: 16/029,799

(22) Filed: Jul. 9, 2018

(65) Prior Publication Data
US 2019/0259747 A1    Aug. 22, 2019

(30) Foreign Application Priority Data

Feb. 22, 2018  (JP) .................................. 2018-029695

(51) Int. Cl.
| | |
|---|---|
| *H01L 27/06* | (2006.01) |
| *H01L 29/06* | (2006.01) |
| *H01L 29/861* | (2006.01) |
| *H01L 29/10* | (2006.01) |
| *H01L 29/739* | (2006.01) |

(Continued)

(52) U.S. Cl.
CPC ...... *H01L 27/0664* (2013.01); *H01L 29/0615* (2013.01); *H01L 29/0619* (2013.01); *H01L 29/0623* (2013.01); *H01L 29/0696* (2013.01); *H01L 29/1095* (2013.01); *H01L 29/4236* (2013.01); *H01L 29/7397* (2013.01); *H01L 29/8613* (2013.01); *H01L 29/407* (2013.01)

(58) Field of Classification Search
CPC ............ H01L 27/0664; H01L 29/0623; H01L 29/0696; H01L 29/1095; H01L 29/7397; H01L 29/8613

See application file for complete search history.

(56) References Cited

U.S. PATENT DOCUMENTS

| 8,716,746 B2 | 5/2014 | Koyama et al. |
| 9,391,070 B2 | 7/2016 | Matsudai et al. |

(Continued)

FOREIGN PATENT DOCUMENTS

| JP | 5630579 | 11/2014 |
| JP | 5664029 | 2/2015 |
| JP | 2016-58654 | 4/2016 |

*Primary Examiner* — Peter Bradford
(74) *Attorney, Agent, or Firm* — Oblon, McClelland, Maier & Neustadt, L.L.P.

(57) ABSTRACT

According to one embodiment, a semiconductor device includes a first electrode, a first semiconductor region, a second semiconductor region, a third semiconductor region, a fourth semiconductor region, a gate electrode, a fifth semiconductor region, a sixth semiconductor region, a seventh semiconductor region, an eighth semiconductor region, and a second electrode. The first semiconductor region is provided on the first electrode. The eighth semiconductor region surrounds the third semiconductor region, the sixth semiconductor region, and the seventh semiconductor region. The eighth semiconductor region includes a first region and a second region respectively arranged with the third semiconductor region and the seventh semiconductor region in a third direction. A lower end of the second region is positioned higher than a lower end of the first region.

9 Claims, 9 Drawing Sheets

(51) Int. Cl.
*H01L 29/423* (2006.01)
*H01L 29/40* (2006.01)

(56) References Cited

U.S. PATENT DOCUMENTS

| | | | |
|---|---|---|---|
| 2012/0043581 A1* | 2/2012 | Koyama | H01L 29/8613 257/140 |
| 2012/0132954 A1* | 5/2012 | Kouno | H01L 29/0696 257/140 |
| 2014/0070266 A1* | 3/2014 | Matsudai | H01L 29/0834 257/139 |
| 2014/0084335 A1 | 3/2014 | Senoo et al. | |
| 2015/0263144 A1* | 9/2015 | Misu | H01L 29/407 257/139 |
| 2018/0269063 A1* | 9/2018 | Kodama | H01L 21/046 |
| 2018/0308839 A1* | 10/2018 | Takahashi | H01L 29/0696 |

* cited by examiner

IGBT SEMICONDUCTOR DEVICE

CROSS-REFERENCE TO RELATED APPLICATIONS

This application is based upon and claims the benefit of priority from Japanese Patent Application No. 2018-029695, filed on Feb. 22, 2018; the entire contents of which are incorporated herein by reference.

FIELD

Embodiments described herein relate generally to a semiconductor device.

BACKGROUND

There is an RC (Reverse Conducting)-IGBT that functions as an IGBT (Insulated Gate Bipolar Transistor) and functions as a FWD (Free Wheel Diode). It is desirable for the semiconductor device to be resistant to the occurrence of breakdown.

DETAILED DESCRIPTION

Figure 1:
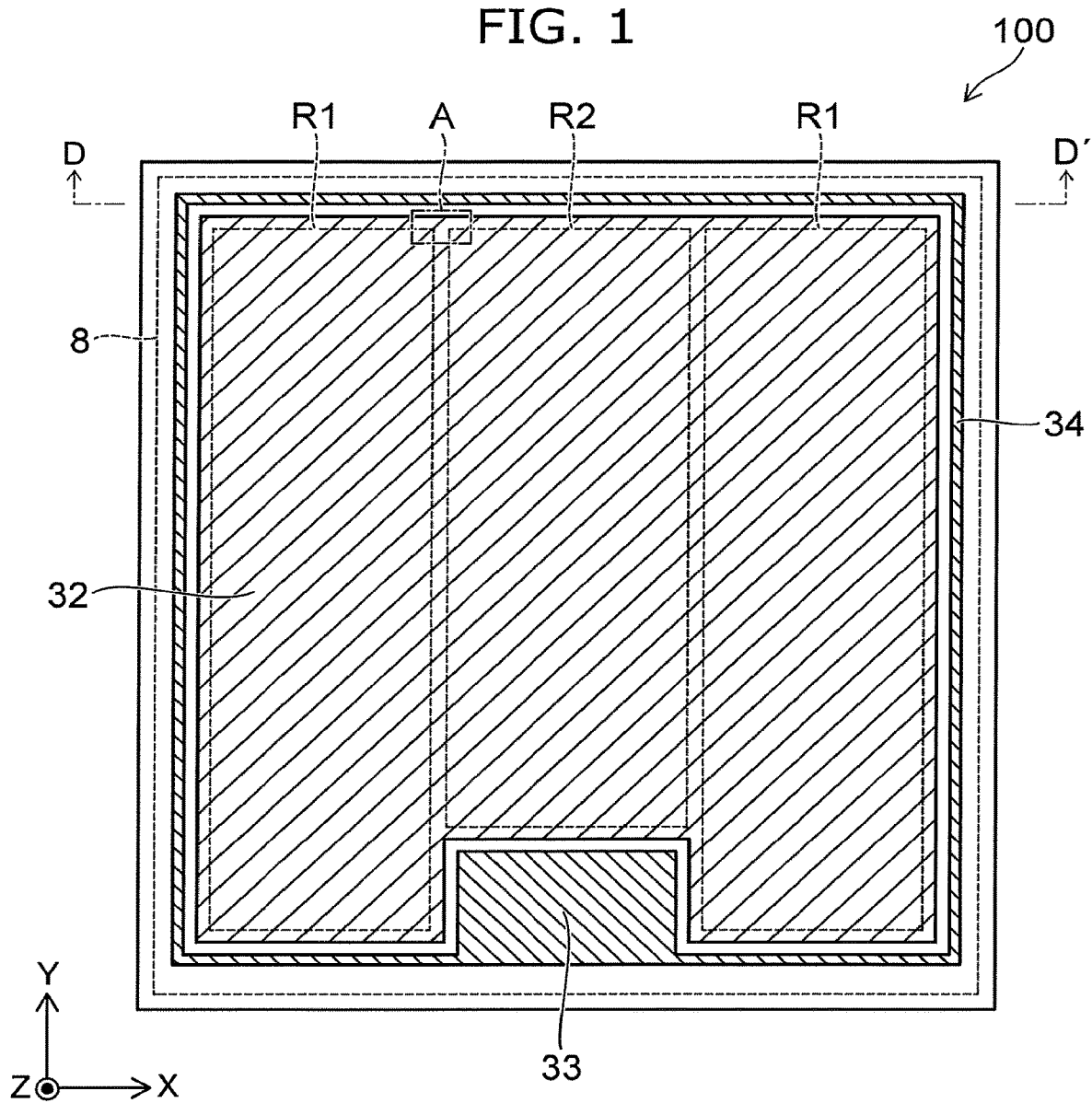
FIG. 1 is a plan view illustrating a semiconductor device according to a first embodiment.

According to one embodiment, a semiconductor device includes a first electrode, a first semiconductor region, a second semiconductor region, a third semiconductor region, a fourth semiconductor region, a gate electrode, a fifth semiconductor region, a sixth semiconductor region, a seventh semiconductor region, an eighth semiconductor region, and a second electrode. The first semiconductor region is provided on the first electrode. The first semiconductor region includes a first portion, a second portion, and a third portion positioned between the first portion and the second portion in a first direction. The first semiconductor region is of a first conductivity type. The second semiconductor region is provided between the first electrode and the first portion. The second semiconductor region is of a second conductivity type. The third semiconductor region is provided on the first portion. The third semiconductor region is of the second conductivity type. A second direction from the second semiconductor region toward the third semiconductor region is perpendicular to the first direction. The fourth semiconductor region is provided on the third semiconductor region. The fourth semiconductor region is of the first conductivity type. The gate electrode opposing, in the first direction with a gate insulating layer interposed, the third semiconductor region, a portion of the first semiconductor region, and at least a portion of the fourth semiconductor region. The fifth semiconductor region is provided between the first electrode and the second portion. The fifth semiconductor region is of the first conductivity type. The sixth semiconductor region is provided on the second portion. The sixth semiconductor region is of the second conductivity type. The seventh semiconductor region is provided on the third portion. The seventh semiconductor region is being of the second conductivity type. The eighth semiconductor region surrounds the third semiconductor region, the sixth semiconductor region, and the seventh semiconductor region. The eighth semiconductor region is of the second conductivity type. The eighth semiconductor region includes a first region and a second region. A portion of the first region is arranged with the third semiconductor region in a third direction perpendicular to the first direction and the second direction. A portion of the second region is arranged with the seventh semiconductor region in the third direction. A lower end of the second region is positioned higher than a lower end of the first region. The second electrode is provided on the fourth semiconductor region, the sixth semiconductor region, the seventh semiconductor region, and the eighth semiconductor region. The second electrode is electrically connected to the fourth semiconductor region, the sixth semiconductor region, the seventh semiconductor region, and the eighth semiconductor region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

In the following descriptions and drawings, notations of $n^+$, $n$, $n^-$ and $p^+$, $p$, $p^-$ represent relative height of an impurity concentration in conductive types. That is, the notation with "+" shows a relatively higher impurity concentration than an impurity concentration for the notation without any of "+" and "+". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

First Embodiment

FIG. 1 is a plan view illustrating a semiconductor device according to a first embodiment.

Figure 2:
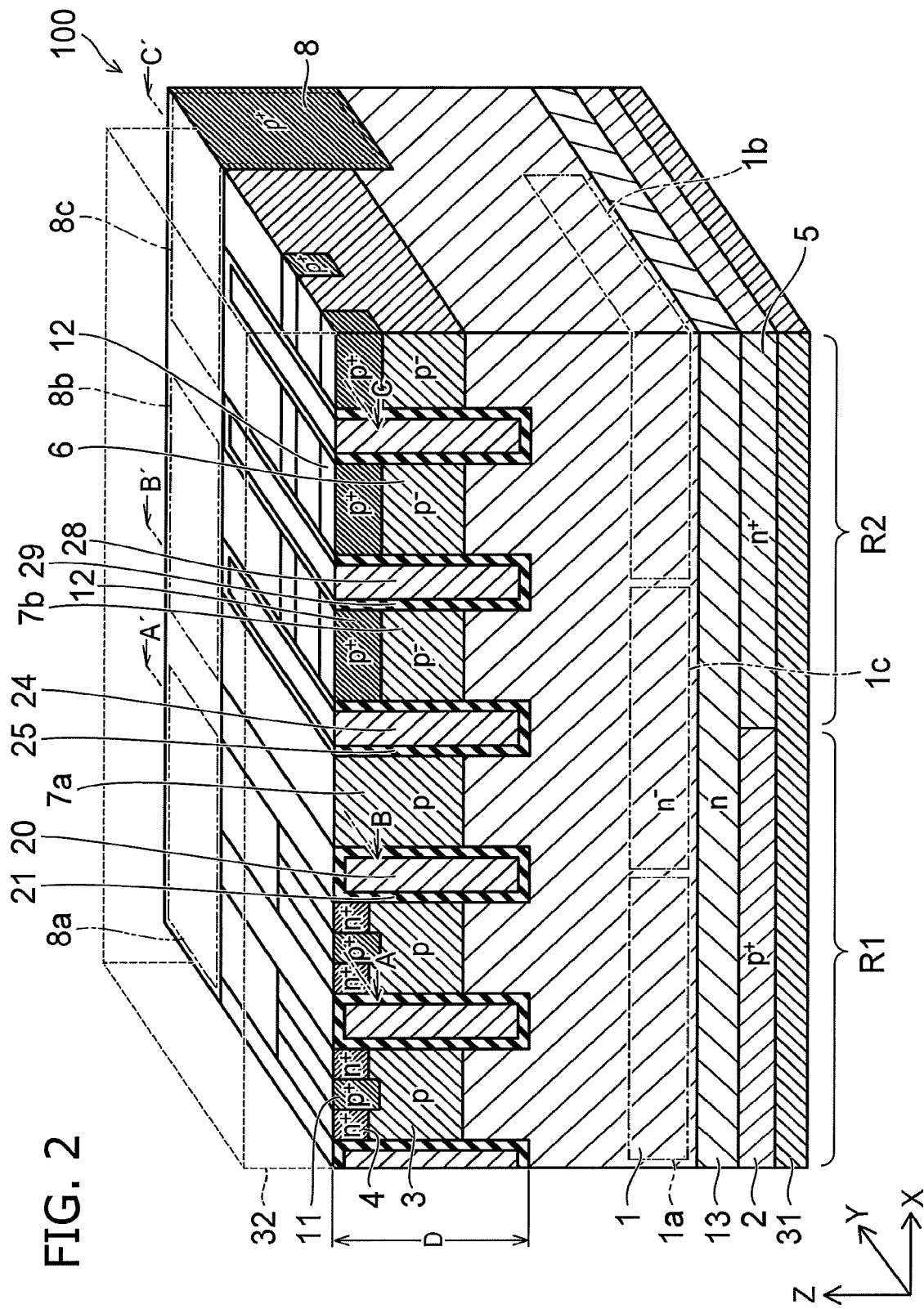
FIG. 2 is a perspective cross-sectional view in which portion A of FIG. 1 is enlarged.

FIG. 2 is a perspective cross-sectional view in which portion A of FIG. 1 is enlarged.

Figure 3A:
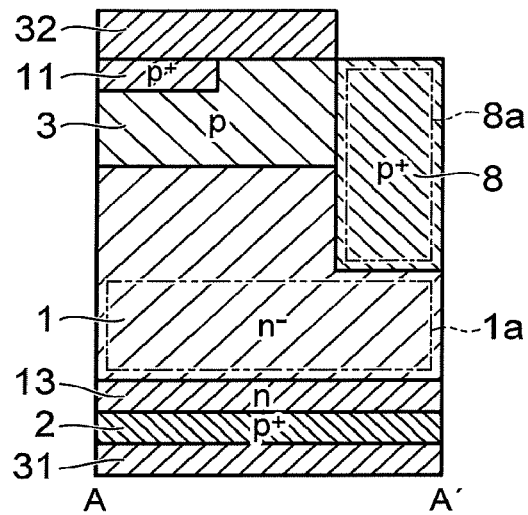
FIG. 3A to FIG. 3C respectively are an A-A' cross-sectional view, a B-B' cross-sectional view, and a C-C' cross-sectional view of FIG. 2.
Figure 3B:
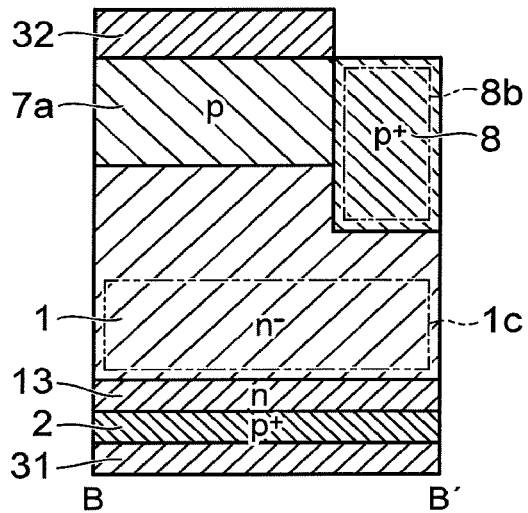
Figure 3C:
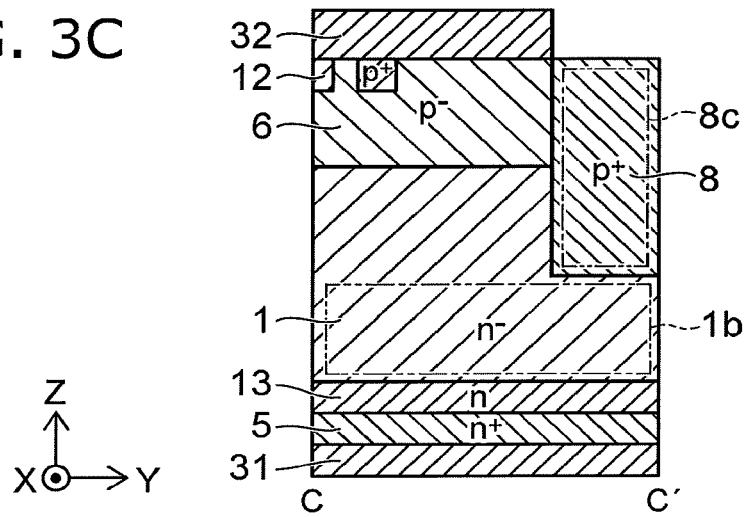

FIG. 3A to FIG. 3C respectively are an A-A' cross-sectional view, a B-B' cross-sectional view, and a C-C' cross-sectional view of FIG. 2.

Figure 4A:
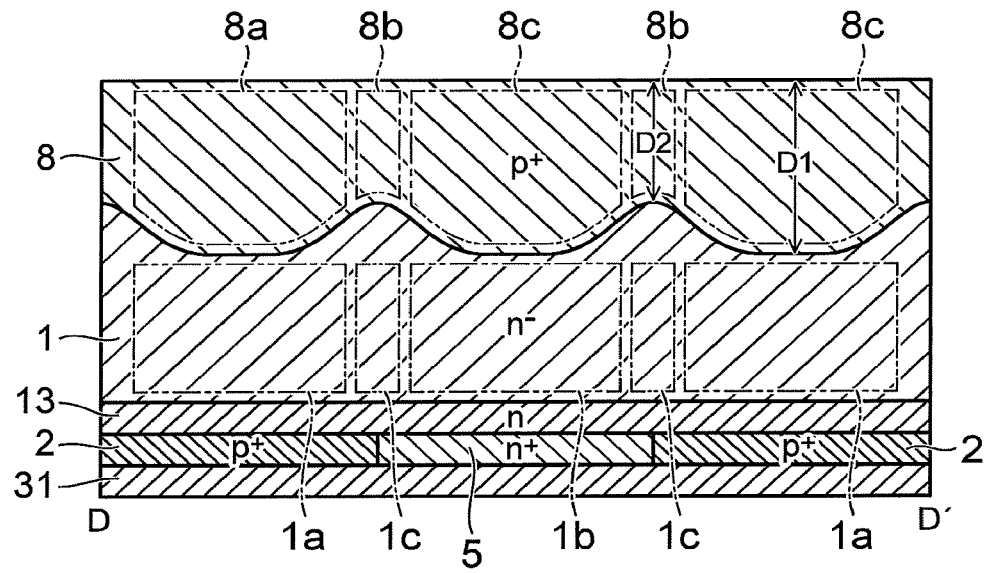
FIGS. 4A and 4B are D-D' cross-sectional views of FIG. 1.
Figure 4B:
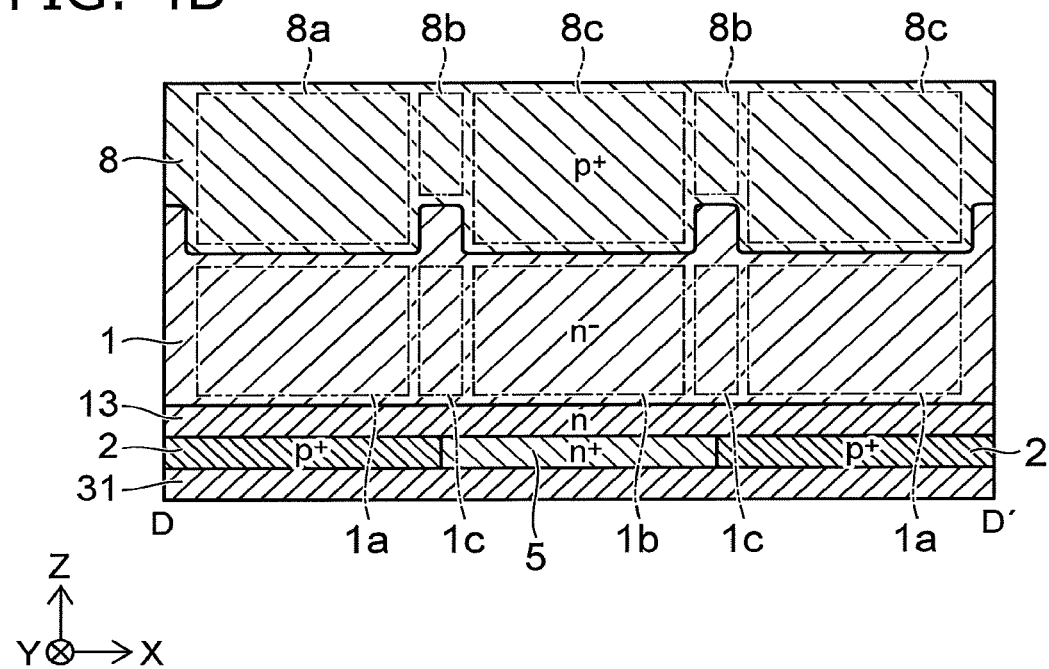

FIGS. 4A and 4B are D-D' cross-sectional views of FIG. 1.

The semiconductor device 100 is an RC-IGBT. As illustrated in FIG. 1, the semiconductor device 100 includes at least one IGBT region R1 and at least one diode region R2. For example, the diode region R2 is positioned between the IGBT regions R1. The IGBT region R1 functions as an IGBT. A current flows in the IGBT region R1 when the semiconductor device 100 is in the on-state. For example, the diode region R2 functions as a freewheeling diode when the semiconductor device 100 is in the off-state.

For example, an emitter electrode 32 (a second electrode), a gate pad 33, and a gate interconnect 34 are provided at the upper surface of the semiconductor device 100.

The emitter electrode 32 is provided on the IGBT region R1 and the diode region R2. The gate pad 33 and the gate interconnect 34 are separated from the emitter electrode 32. The gate interconnect 34 is connected to the gate pad 33 and is provided around the emitter electrode 32.

As illustrated in FIG. 2, the semiconductor device 100 further includes an n$^-$-type (first conductivity-type) drift region (a first semiconductor region), a p$^+$-type (second conductivity-type) collector region 2 (a second semiconductor region), a p-type base region 3 (a third semiconductor region), an n$^+$-type emitter region 4 (a fourth semiconductor region), an n$^+$-type cathode region 5 (a fifth semiconductor region), a p$^-$-type anode region 6 (a sixth semiconductor region), a p-type semiconductor region 7a (an example of a seventh semiconductor region), a p$^-$-type semiconductor region 7b (another example of the seventh semiconductor region), a p$^+$-type guard ring region 8 (an eighth semiconductor region), a p$^+$-type contact region 11, a p$^+$-type anode region 12, an n-type buffer region 13, a gate electrode 20, a gate insulating layer 21, a first conductive portion 24, a first insulating layer 25, a second conductive portion 28, a second insulating layer 29, and a collector electrode 31 (a first electrode).

An XYZ orthogonal coordinate system is used in the description of the embodiments. The direction from the p$^+$-type collector region 2 toward the p-type base region 3 is taken as a Z-direction (a second direction). Two mutually-orthogonal directions perpendicular to the Z-direction are taken as an X-direction (a first direction) and a Y-direction (a third direction). For the description, the direction from the p$^+$-type collector region 2 toward the p-type base region 3 is called "up;" and the reverse direction is called "down." These directions are based on the relative positional relationship between the p$^+$-type collector region 2 and the p-type base region 3 and are independent of the direction of gravity.

The n$^-$-type drift region 1 includes a first portion 1a, a second portion 1b, and a third portion 1c. The third portion 1c is positioned between the first portion 1a and the second portion 1b in the X-direction. The p$^+$-type collector region 2 is provided under the first portion 1a and under a portion of the third portion 1c. The n$^+$-type cathode region 5 is provided under the second portion 1b and under another portion of the third portion 1c.

For example, the n-type buffer region 13 is provided between the n$^-$-type drift region 1 and the p$^+$-type collector region 2 and between the n$^-$-type drift region 1 and the n$^+$-type cathode region 5. The collector electrode 31 is provided under the p$^+$-type collector region 2 and the n$^+$-type cathode region 5 and is electrically connected to the p$^+$-type collector region 2 and the n$^+$-type cathode region 5.

The p-type base region 3 and the gate electrode 20 are provided on the first portion 1a. The n$^+$-type emitter region 4 and the p$^+$-type contact region 11 are provided on the p-type base region 3. The gate electrode 20 opposes, in the X-direction with the gate insulating layer 21 interposed, the p-type base region 3, a portion of the n$^+$-type drift region 1, and at least a portion of the n$^+$-type emitter region 4.

The p$^-$-type anode region 6 and the second conductive portion 28 are provided on the second portion 1b. The p$^+$-type anode region 12 is provided selectively on the p$^-$-type anode region 6. The second conductive portion 28 opposes the p$^-$-type anode region 6 and a portion of the n$^-$-type drift region in the X-direction with the second insulating layer 29 interposed.

The p-type semiconductor region 7a and the p$^-$-type semiconductor region 7b are provided on the third portion 1c. For example, the p-type semiconductor region 7a is positioned directly above the p$^+$-type collector region 2; and the p$^-$-type semiconductor region 7b is positioned directly above the n$^+$-type cathode region 5. The p$^+$-type anode region 12 may be provided on the p$^-$-type semiconductor region 7b. The first conductive portion 24 is positioned between the p-type semiconductor region 7a and the p$^-$-type semiconductor region 7b in the X-direction and opposes these semiconductor regions with the first insulating layer 25 interposed. The p-type semiconductor region 7a is positioned between the gate electrode 20 and the first conductive portion 24 in the X-direction and extends in the Y-direction. The p$^-$-type semiconductor region 7b is positioned between the first conductive portion 24 and the second conductive portion 28 in the X-direction and extends in the Y-direction.

The emitter electrode 32 is provided on the p-type base region 3, the n$^+$-type emitter region 4, the p$^+$-type contact region 11, the p-type semiconductor region 7a, the p$^-$-type semiconductor region 7b, the p$^-$-type anode region 6, the p$^+$-type anode region 12, the p$^+$-type guard ring region 8, the first conductive portion 24, and the second conductive portion 28 and is electrically connected to these components. The gate electrode 20 is electrically connected to the gate pad 33 via the gate interconnect 34. The gate electrode 20 is electrically isolated from the emitter electrode 32.

For example, the p-type base region 3, the n$^+$-type emitter region 4, the p$^+$-type contact region 11, the p$^-$-type anode region 6, the gate electrode 20, the first conductive portion 24, and the second conductive portion 28 each are multiply provided in the X-direction and extend in the Y-direction. For example, the p$^+$-type anode regions 12 are multiply provided in the Y-direction on each p$^-$-type anode region 6. The p-type semiconductor region 7a and the p$^-$-type semiconductor region 7b extend in the Y-direction.

In FIG. 1, the outer edge of the p$^+$-type guard ring region 8 is illustrated by a broken line. The p$^+$-type guard ring region 8 surrounds the multiple p-type base regions 3, the multiple p$^-$-type anode regions 6, the p-type semiconductor region 7a, and the p$^-$-type semiconductor region 7b. As illustrated in FIG. 2, the p$^+$-type guard ring region 8 includes a first region 8a, a second region 8b, and a third region 8c.

As illustrated in FIG. 3A, a portion of the first region 8a is arranged with the p-type base region 3 in the Y-direction. As illustrated in FIG. 3B, a portion of the second region 8b is arranged with the p-type semiconductor region 7a in the Y-direction. Another portion of the second region 8b is arranged with the p$^-$-type semiconductor region 7b in the Y-direction. As illustrated in FIG. 3C, a portion of the third region 8c is arranged with the p⁻-type anode region 6 in the Y-direction.

The lower end of the second region 8b is positioned higher than the lower end of the first region 8a and the lower end of the third region 8c. In other words, the p-n junction surface between the second region 8b and the n⁻-type drift region 1 is positioned higher than the p-n junction surface between the first region 8a and the n⁻-type drift region 1 and the p-n junction surface between the third region 8c and the n⁻-type drift region 1.

For example, the position of the lower end of the p⁺-type guard ring region 8 changes continuously as illustrated in FIG. 4A. Or, the position of the lower end of the p⁺-type guard ring region 8 may change in a step configuration as illustrated in FIG. 4B. For example, it is desirable for the deepest depth (longest length in the Z-direction) D1 of the first region 8a to be not less than 1.0 times and not more than 2.0 times the depth D (illustrated in FIG. 2) of the gate insulating layer 21, the first insulating layer 25, or the second insulating layer 29. In other words, the depth D is the distance in the Z-direction between the emitter electrode 32 and the lower ends of these insulating layers. The shallowest depth (the shortest length in the Z-direction) D2 of the second region 8b is greater than D but less than D1. For example, the lower end of the third region 8c is positioned lower than the lower end of the second region 8b. Or, the lower end of the third region 8c may be at the same position as the lower end of the second region 8b.

Operations of the semiconductor device 100 will now be described.

When a voltage that is a threshold or more is applied to the gate electrode 20 in a state in which a voltage that is positive with respect to the emitter electrode 32 is applied to the collector electrode 31, the semiconductor device 100 is set to an on-state. At this time, a channel (an inversion layer) is formed in a region of the p-type base region 3 at the gate insulating layer 21 vicinity. Electrons pass through the channel and are injected from the n⁺-type emitter region 4 into the n⁻-type drift region 1; and holes are injected from the p⁺-type collector region 2 into the n⁻-type drift region 1. Thereby, a current flows in the IGBT region R1. Subsequently, when the voltage that is applied to the gate electrode 20 becomes lower than the threshold, the channel in the p-type base region 3 disappears; and the semiconductor device 100 is set to an off-state.

For example, a bridge circuit is configured using the multiple semiconductor devices 100. In such a case, when one semiconductor device 100 is switched from the on-state to the off-state, an induced electromotive force is applied to an emitter electrode 32 of another semiconductor device 100 due to the inductance component of the bridge circuit. Thereby, the diode region R2 operates in the other semiconductor device 100. Holes are injected from the p⁻-type anode region 6 (the p⁺-type anode region 12) into the n⁻-type drift region 1. Electrons are injected from the n⁺-type cathode region 5 into the n⁻-type drift region 1.

Examples of the materials of the components of the semiconductor device 100 will now be described.

The n⁻-type drift region 1, the p⁺-type collector region 2, the p-type base region 3, the n⁺-type emitter region 4, the n⁺-type cathode region 5, the p⁻-type anode region 6, the p-type semiconductor region 7a, the p⁻-type semiconductor region 7b, the p⁺-type guard ring region 8, the p⁺-type contact region 11, the p⁺-type anode region 12, and the n-type buffer region 13 include silicon, silicon carbide, gallium nitride, or gallium arsenide as a semiconductor material. In the case where silicon is used as the semiconductor material, arsenic, phosphorus, or antimony may be used as an n-type impurity. Boron may be used as a p-type impurity.

The gate electrode 20, the first conductive portion 24, and the second conductive portion 28 include a conductive material such as polysilicon, etc.

The gate insulating layer 21, the first insulating layer 25, and the second insulating layer 29 include an insulating material such as silicon oxide, etc.

The collector electrode 31, the emitter electrode 32, the gate pad 33, and the gate interconnect 34 include a metal such as aluminum, etc.

Effects of the first embodiment will now be described.

When the semiconductor device 100 is switched from the on-state to the off-state, there are cases where an induced electromotive force is applied to the collector electrode 31 due to the inductance component of the electrical circuit to which the semiconductor device 100 is connected. When the induced electromotive force is applied to the collector electrode 31, avalanche breakdown occurs in the IGBT region R1 interior. Generally, the avalanche breakdown occurs locally in the IGBT region R1. Thereby, a current filament that flows through the IGBT region R1 is formed. When the current filament is formed, the temperature at that location increases. Accordingly, if the current filament is continued to be formed at the same location, breakdown of the semiconductor device 100 ultimately occurs due to thermal runaway.

The inventor discovered that in an RC-IGBT, the breakdown due to the current filament occurs at the vicinity of the boundary between the IGBT region R1 and the diode region R2 and occurs particularly easily at the portion of the p⁺-type guard ring region 8 vicinity. By performing investigations based on this knowledge, the inventor discovered the following. The breakdown due to the current filament does not occur easily at a portion when the electric field of the portion is set to be lower than the electric field at the p⁺-type guard ring region 8 vicinity of the IGBT region R1.

In the semiconductor device 100, the n⁻-type drift region 1 includes the third portion 1c positioned between the first portion 1a and the second portion 1b. The first portion 1a is included in the IGBT region R1. The second portion 1b is included in the diode region R2. The p-type semiconductor region 7a and the p⁻-type semiconductor region 7b are provided on the third portion 1c. A portion of the second region 8b of the p⁺-type guard ring region 8 is arranged in the Y-direction with the p-type semiconductor region 7a and the p⁻-type semiconductor region 7b. The lower end of the second region 8b is positioned higher than the lower end of the first region 8a arranged in the Y-direction with the p-type base region 3. According to this configuration, the electric field can be reduced at the location where the breakdown due to the current filament forms easily in a conventional semiconductor device; and the likelihood of the breakdown occurring at that location can be reduced.

Modification

Figure 5A:
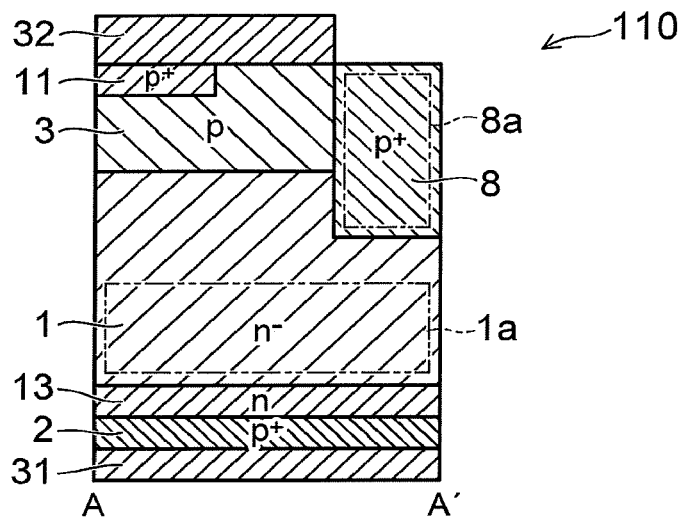
FIGS. 5A to 5C are cross-sectional views illustrating portions of a semiconductor device according to a modification of the first embodiment.
Figure 5B:
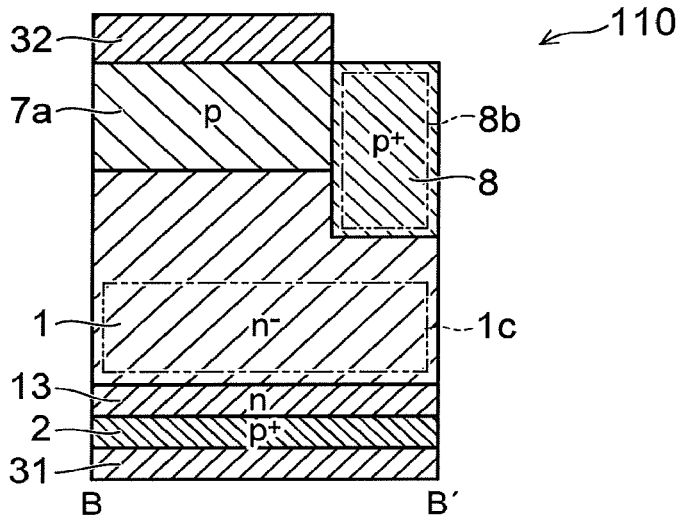
Figure 5C:
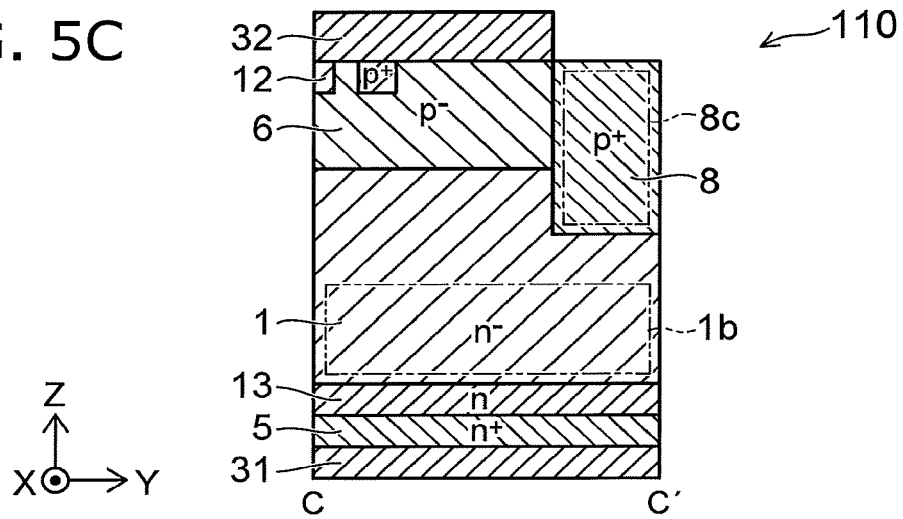

FIGS. 5A to 5C are cross-sectional views illustrating portions of a semiconductor device according to a modification of the first embodiment.

Figure 6A:
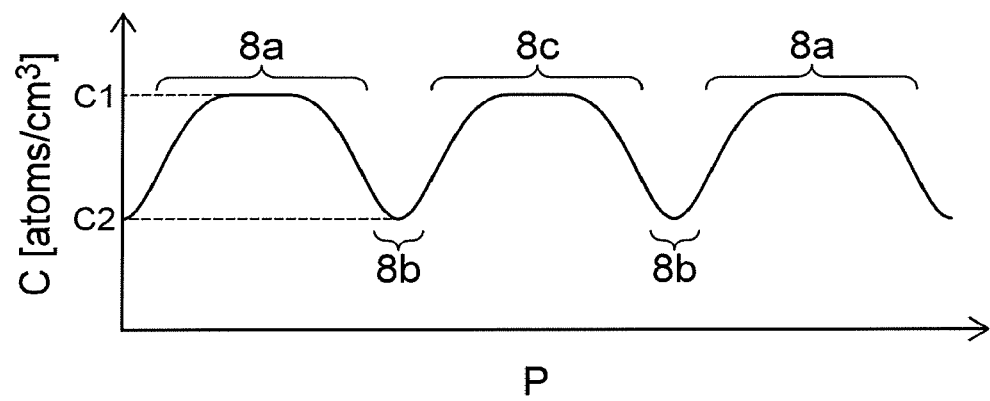
FIGS. 6A and 6B are graphs illustrating characteristics of the semiconductor device according to the modification of the first embodiment.
Figure 6B:
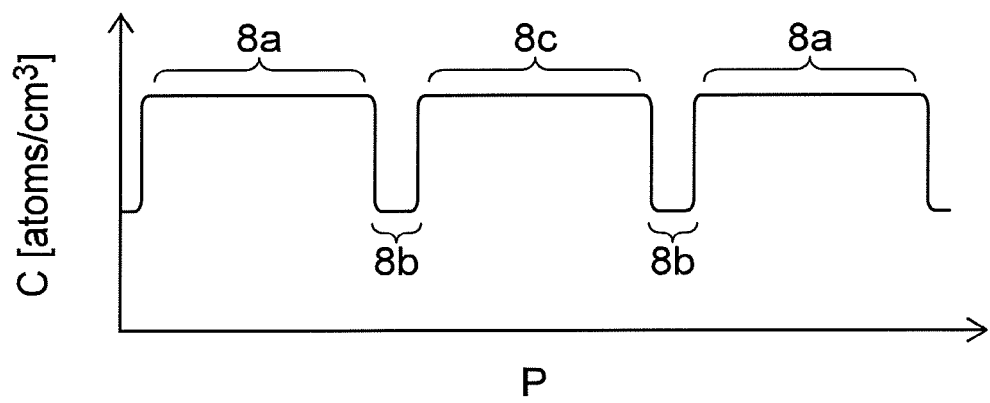

FIGS. 6A and 6B are graphs illustrating characteristics of the semiconductor device according to the modification of the first embodiment.

The structure of the p⁺-type guard ring region 8 of the semiconductor device 110 according to the modification is different from that of the semiconductor device 100. FIG. 5A to FIG. 5C correspond respectively to the A-A' cross-sectional view, the B-B' cross-sectional view, and the C-C' cross-sectional view of FIG. 2. In the semiconductor device 110 as illustrated in FIG. 5A to FIG. 5C, the lower ends of the first to third regions 8a to 8c are at the same position.

In FIGS. 6A and 6B, the horizontal axis is a position P in the X-direction. The vertical axis is a p-type impurity concentration C [atoms/cm$^3$] at each point of the p$^+$-type guard ring region 8. As illustrated in FIGS. 6A and 6B, the p-type impurity concentration in the second region 8b is lower than the p-type impurity concentration in the first region 8a. For example, it is desirable for a p-type impurity concentration C1 of the peak in the first region 8a to be not less than 1.1 times and not more than 10 times the lowest p-type impurity concentration C2 in the second region 8b.

For example, the p-type impurity concentration in the third region 8c is higher than the p-type impurity concentration in the second region 8b. Or, the p-type impurity concentration in the third region 8c may be the same as the p-type impurity concentration in the second region 8b.

The p-type impurity concentration in the second region 8b is lower than the p-type impurity concentration in the first region 8a. Thereby, similarly to the semiconductor device 100, the electric field intensity at the second region 8b vicinity can be lower than the electric field intensity at the first region 8a vicinity. As a result, similarly to the semiconductor device 100, the likelihood of the breakdown due to the current filament forming can be reduced.

In the semiconductor device 110, similarly to the semiconductor device 100, the lower end of the second region 8b may be positioned higher than the lower end of the first region 8a. Thereby, the electric field intensity at the second region 8b vicinity can be reduced further.

Second Embodiment

Figure 7:
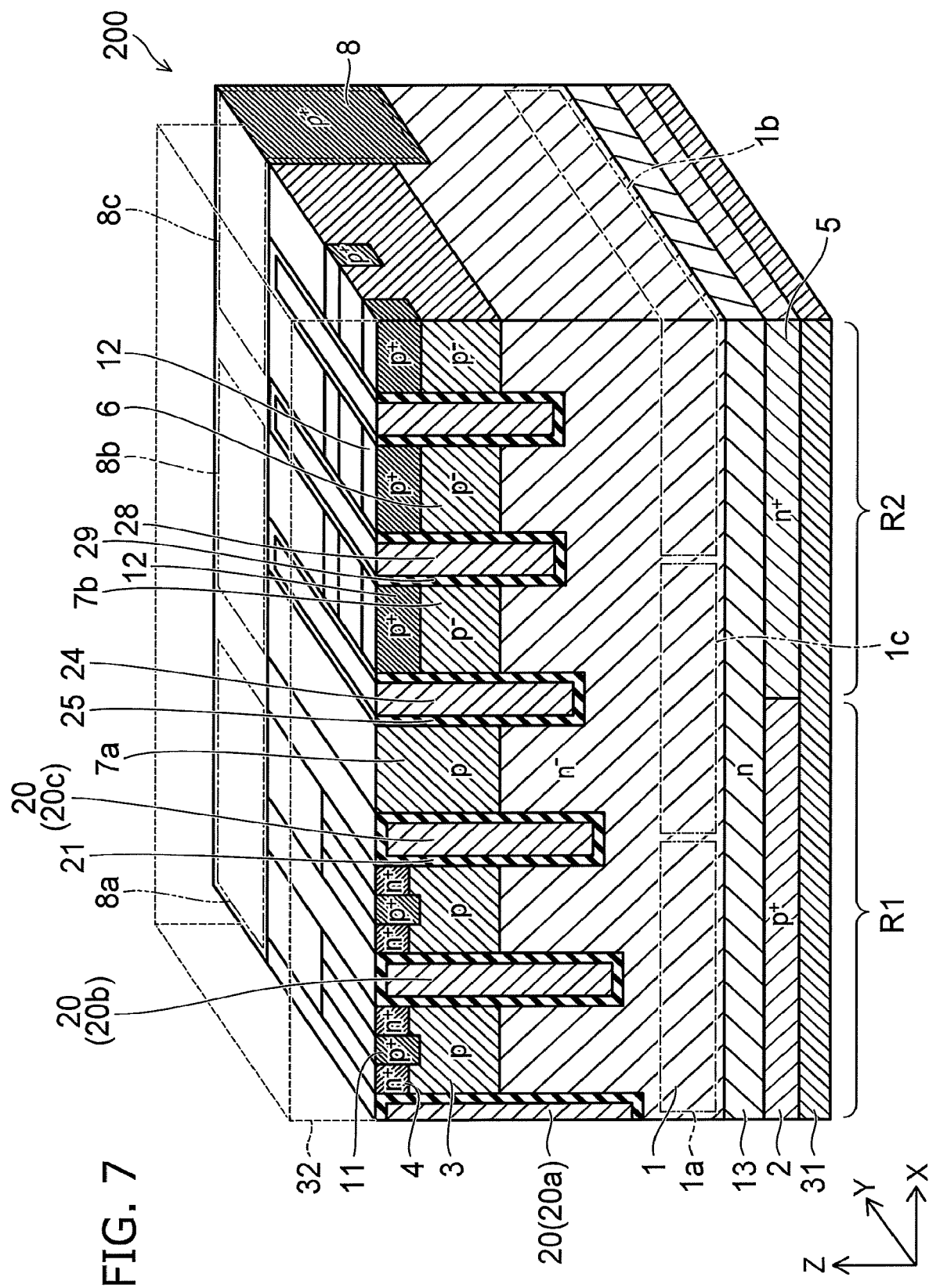
FIG. 7 is a perspective cross-sectional view illustrating a semiconductor device according to a second embodiment.

FIG. 7 is a perspective cross-sectional view illustrating a semiconductor device according to a second embodiment.

The structure of the gate electrode 20 of the semiconductor device 200 according to the second embodiment is different from that of the semiconductor device 100.

In the semiconductor device 200, the lower end of the first insulating layer 25 and the lower end of the second insulating layer 29 are positioned higher than the lower end of the gate insulating layer 21. In other words, the lower end of the first conductive portion 24 and the lower end of the second conductive portion 28 are positioned higher than the lower end of the gate electrode 20. The lengths in the Z-direction of the first conductive portion 24 and the second conductive portion 28 are shorter than the length in the Z-direction of the gate electrode 20.

The multiple gate electrodes 20 include gate electrodes 20a, 20b, and 20c. The lower end of the gate electrode 20b is positioned higher than the lower end of the gate electrode 20a and positioned lower than the lower end of the gate electrode 20c. In the X-direction, the gate electrode 20c is positioned between the p-type base region 3 and the p-type semiconductor region 7a and between the gate electrode 20b and the first conductive portion 24. The gate electrode 20b is positioned further on the p-type semiconductor region 7a side than is the gate electrode 20a. In other words, the position of the lower end of the gate electrode 20 is positioned higher toward the p-type semiconductor region 7a (the diode region R2).

The lower end of the gate electrode 20c provided at the boundary vicinity between the IGBT region R1 and the diode region R2 is positioned higher than the lower ends of the gate electrodes 20a and 20b provided on the center side of the IGBT region R1. Thereby, the electric field intensity at the boundary vicinity can be reduced. As a result, the electric field intensity at the second region 8b vicinity also can be reduced; and the likelihood of the breakdown due to the current filament forming can be reduced.

Desirably, the lower end of the gate electrode 20b is positioned higher than the lower end of the gate electrode 20a. Inside the IGBT region R1, the lower end of the gate electrode 20 is positioned higher toward the diode region R2. Thereby, the electric field intensity at the boundary vicinity between the IGBT region R1 and the diode region R2 can be reduced even further.

Third Embodiment

Figure 8:
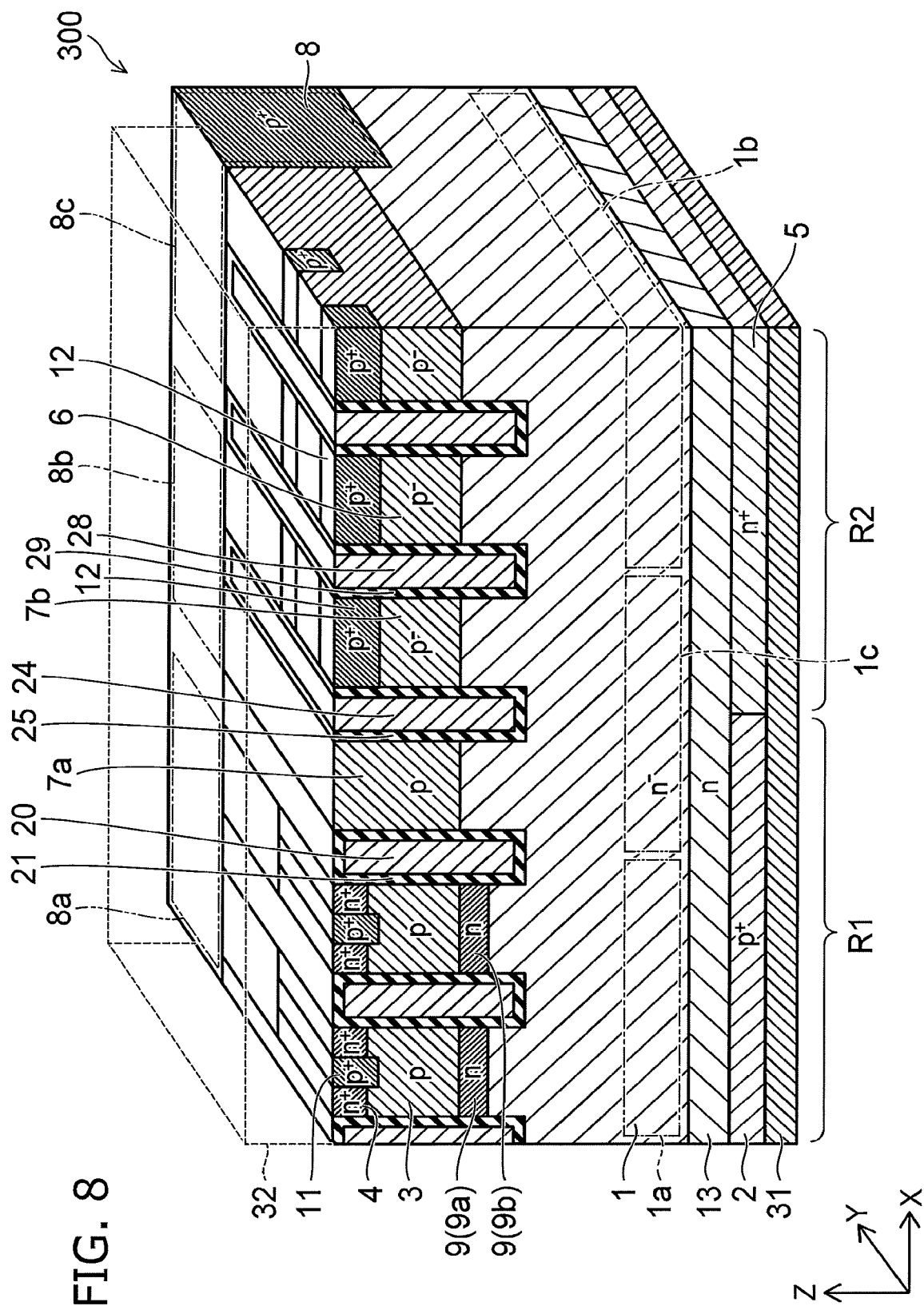
FIG. 8 is a perspective cross-sectional view illustrating a semiconductor device according to a third embodiment.

FIG. 8 is a perspective cross-sectional view illustrating a semiconductor device according to a third embodiment.

The semiconductor device 300 according to the third embodiment further includes an n-type barrier region 9 (a ninth semiconductor region). The n-type barrier region 9 is multiply provided in the X-direction. The multiple n-type barrier regions 9 are provided respectively between the first portion 1a and the multiple p-type base regions 3 in the Z-direction.

The multiple n-type barrier regions 9 include an n-type barrier region 9a and an n-type barrier region 9b. The n-type impurity concentration of the n-type barrier region 9b is lower than the n-type impurity concentration of the n-type barrier region 9a. The position in the X-direction of the n-type barrier region 9b is between the position in the X-direction of the p-type semiconductor region 7a and the position in the X-direction of the n-type barrier region 9a. In other words, the n-type impurity concentration of the n-type barrier region 9 decreases toward the p-type semiconductor region 7a (the diode region R2).

The n-type impurity concentration of the n-type barrier region 9b provided at the boundary vicinity between the IGBT region R1 and the diode region R2 is lower than the n-type impurity concentration of the n-type barrier region 9a provided on the center side of the IGBT region R1. Thereby, the electric field intensity at the boundary vicinity can be reduced. As a result, the electric field intensity at the second region 8b vicinity also can be reduced; and the likelihood of the breakdown due to the current filament forming can be reduced.

Desirably, the n-type impurity concentration of the n-type barrier region 9a is lower than the n-type impurity concentration of the other n-type barrier regions 9. The other n-type barrier regions 9 are provided further on the center side of the IGBT region R1 than is the n-type barrier region 9a. Inside the IGBT region R1, the concentration of the n-type barrier region 9 decreases toward the diode region R2. Thereby, the electric field intensity at the boundary vicinity between the IGBT region R1 and the diode region R2 can be reduced even further.

For the levels of the n-type impurity concentrations between the n-type barrier regions 9 in the embodiment, both a p-type impurity and an n-type impurity may be included in the n-type barrier region 9. In such a case, it is sufficient for the relative level of the net impurity concentration after the impurities are compensated to have the relationship described above.

Fourth Embodiment

Figure 9:
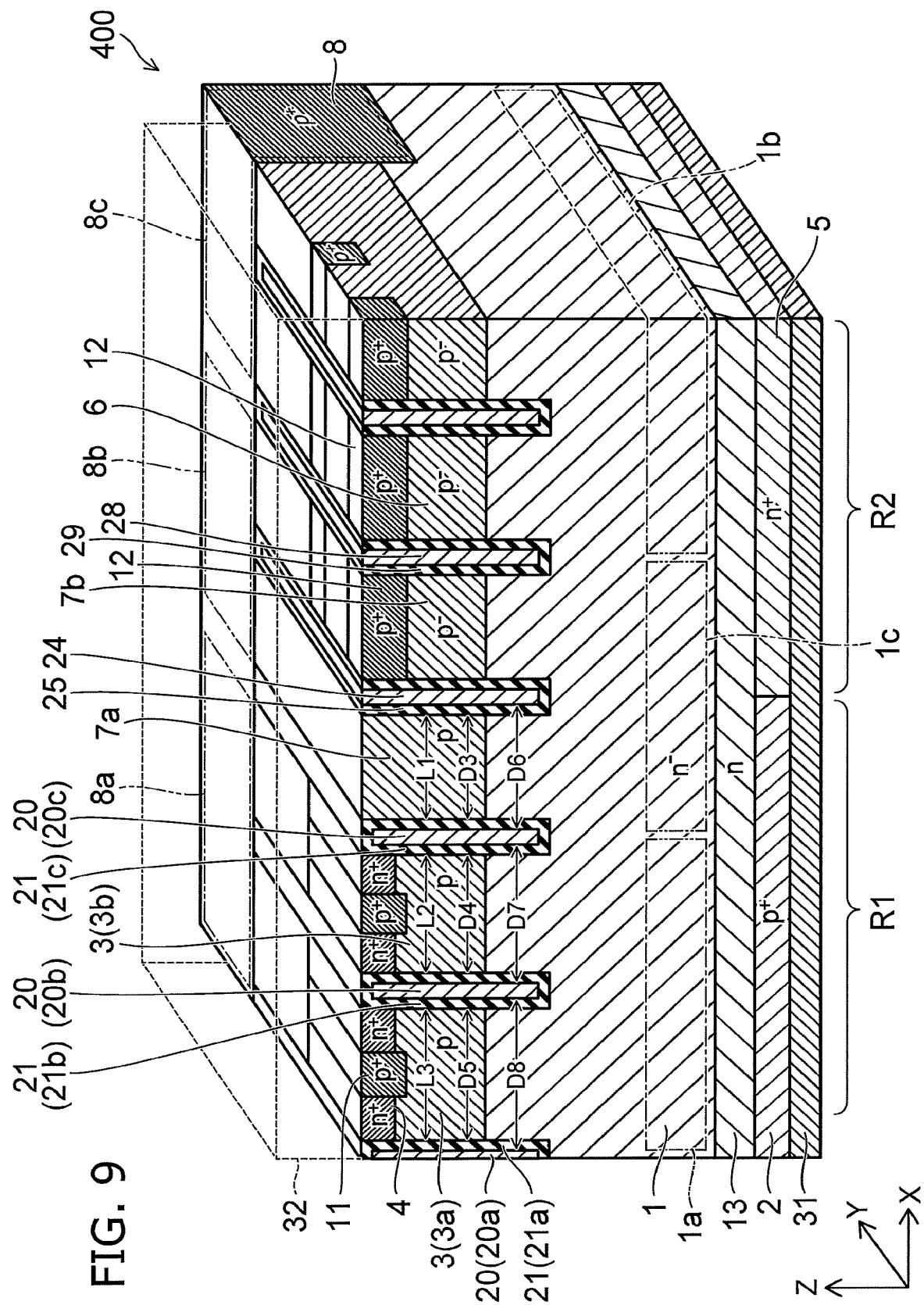
FIG. 9 is a perspective cross-sectional view illustrating a semiconductor device according to a fourth embodiment.

FIG. 9 is a perspective cross-sectional view illustrating a semiconductor device according to a fourth embodiment.

As illustrated in FIG. 9, the multiple gate electrodes 20 include the gate electrode 20a, the gate electrode 20b, and the gate electrode 20c. The multiple gate insulating layers 21 include a gate insulating layer 21a, a gate insulating layer 21b, and a gate insulating layer 21c.

In the semiconductor device 400 according to the fourth embodiment, a distance D3 is shorter than a distance D4. The distance D3 is the distance between the first insulating layer 25 and the gate insulating layer 21c adjacent to the first insulating layer 25 in the X-direction. The distance D4 is the distance between the gate insulating layer 21b and the gate insulating layer 21c adjacent to each other in the X-direction.

Accordingly, a distance D6 is shorter than a distance D7. The distance D6 is the distance between the first conductive portion 24 and the gate electrode 20c adjacent to the first conductive portion 24 in the X-direction. The distance D7 is the distance between the gate electrode 20b and the gate electrode 20c adjacent to each other in the X-direction.

The distance D4 is shorter than a distance D5 in the X-direction between the gate insulating layer 21a and the gate insulating layer 21b. Accordingly, the distance D7 is shorter than a distance D8 in the X-direction between the gate electrode 20a and the gate electrode 20b.

According to the configuration recited above, a length L1 in the X-direction of the p-type semiconductor region 7a is shorter than a length L2 in the X-direction of a p-type base region 3b adjacent to the p-type semiconductor region 7a. The length L2 of the p-type base region 3b is shorter than a length L3 in the X-direction of a p-type base region 3a.

According to this configuration, similarly to the other embodiments, the electric field intensity at the boundary vicinity can be reduced. Thereby, the electric field intensity at the second region 8b vicinity can be reduced; and the likelihood of the breakdown due to the current filament forming can be reduced.

Desirably, the distance D5 is shorter than the distance in the X-direction between the mutually-adjacent gate insulating layers 21 provided further on the center side of the IGBT region R1. The distance D8 is shorter than the distance in the X-direction between the mutually-adjacent gate electrodes 20 provided further on the center side of the IGBT region R1. The length L3 is shorter than the length in the X-direction of the other p-type base regions 3 provided further on the center side of the IGBT region R1. According to such a configuration, the electric field intensity at the boundary vicinity between the IGBT region R1 and the diode region R2 can be reduced even further.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM.

It is possible to measure the impurity concentration in each semiconductor region by, for example, SIMS (secondary ion mass spectrometry).

An embodiment of the invention may include the following configurations.

Configuration 1

A semiconductor device, comprising:

a first electrode:

a first semiconductor region provided on the first electrode, the first semiconductor region including a first portion, a second portion, and a third portion positioned between the first portion and the second portion in a first direction, the first semiconductor region being of a first conductivity type;

a second semiconductor region provided between the first electrode and the first portion, the second semiconductor region being of a second conductivity type;

a third semiconductor region provided on the first portion, the third semiconductor region being of the second conductivity type, a second direction from the second semiconductor region toward the third semiconductor region being perpendicular to the first direction;

a fourth semiconductor region provided on the third semiconductor region, the fourth semiconductor region being of the first conductivity type;

a gate electrode, the gate electrode opposing, in the first direction with a gate insulating layer interposed, the third semiconductor region, a portion of the first semiconductor region, and at least a portion of the fourth semiconductor region;

a fifth semiconductor region provided between the first electrode and the second portion, the fifth semiconductor region being of the first conductivity type;

a sixth semiconductor region provided on the second portion, the sixth semiconductor region being of the second conductivity type;

a seventh semiconductor region provided on the third portion, the seventh semiconductor region being of the second conductivity type;

a first conductive portion opposing the seventh semiconductor region in the first direction with a first insulating layer interposed, a lower end of the first conductive portion being positioned higher than a lower end of the gate electrode;

an eighth semiconductor region surrounding the third semiconductor region, the sixth semiconductor region, and the seventh semiconductor region and being of the second conductivity type; and a second electrode provided on the fourth semiconductor region, the sixth semiconductor region, the seventh semiconductor region, and the eighth semiconductor region, the second electrode being electrically connected to the fourth semiconductor region, the sixth semiconductor region, the seventh semiconductor region, and the eighth semiconductor region.

Configuration 2

A semiconductor device, comprising:

a first electrode:

a first semiconductor region provided on the first electrode, the first semiconductor region including a first portion, a second portion, and a third portion positioned between the first portion and the second portion in a first direction, the first semiconductor region being of a first conductivity type;

a second semiconductor region provided between the first electrode and the first portion, the second semiconductor region being of a second conductivity type;

a third semiconductor region provided on the first portion, the third semiconductor region being of the second conductivity type, a second direction from the second semiconductor region toward the third semiconductor region being perpendicular to the first direction;

a fourth semiconductor region provided on the third semiconductor region, the fourth semiconductor region being of the first conductivity type;

multiple gate electrodes, one of the multiple gate electrodes opposing, in the first direction with a gate insulating layer interposed, the third semiconductor region, a portion of the first semiconductor region, and at least a portion of the fourth semiconductor region;

a fifth semiconductor region provided between the first electrode and the second portion, the fifth semiconductor region being of the first conductivity type;

a sixth semiconductor region provided on the second portion, the sixth semiconductor region being of the second conductivity type;

a seventh semiconductor region provided on the third portion, the seventh semiconductor region being of the second conductivity type;

a first conductive portion opposing the seventh semiconductor region in the first direction with a first insulating layer interposed, a distance between the first conductive portion and one of the multiple gate electrodes adjacent to the first conductive portion in the first direction being shorter than a distance between the gate electrodes adjacent to each other in the first direction;

an eighth semiconductor region surrounding the third semiconductor region, the sixth semiconductor region, and the seventh semiconductor region and being of the second conductivity type; and a second electrode provided on the fourth semiconductor region, the sixth semiconductor region, the seventh semiconductor region, and the eighth semiconductor region, the second electrode being electrically connected to the fourth semiconductor region, the sixth semiconductor region, the seventh semiconductor region, and the eighth semiconductor region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
   a first electrode;
   a first semiconductor region provided on the first electrode, the first semiconductor region including a first portion, a second portion, and a third portion, the first to third portions being arranged in a first direction along a surface of the first electrode, the surface of the first electrode opposing the first semiconductor region, the third portion being positioned between the first portion and the second portion, the first semiconductor region being of a first conductivity type;
   a second semiconductor region provided between the first electrode and the first portion of the first semiconductor region, the second semiconductor region being of a second conductivity type;
   a third semiconductor region provided on the first portion of the first semiconductor region, the third semiconductor region being of the second conductivity type, the first to third semiconductor regions being arranged in a second direction perpendicular to the surface of the first electrode, the first portion of the first semiconductor region being provided between the second and third semiconductor regions;
   a fourth semiconductor region provided on the third semiconductor region, the fourth semiconductor region being of the first conductivity type;
   a plurality of gate electrodes provided on the first portion of the first semiconductor region, the plurality of gate electrodes each opposing the first and third semiconductor regions and at least a portion of the fourth semiconductor region with a gate insulating layer interposed;
   a fifth semiconductor region provided between the first electrode and the second portion of the first semiconductor region, the fifth semiconductor region being of the first conductivity type;
   a sixth semiconductor region provided on the second portion of the first semiconductor region, the sixth semiconductor region being of the second conductivity type, the fifth and sixth semiconductor regions being arranged in the second direction with the second portion of the first semiconductor region interposed;
   a seventh semiconductor region provided on the third portion of the first semiconductor region, the third portion of the first semiconductor region being provided on a boundary of the second and fifth semiconductor regions, the seventh semiconductor region being of the second conductivity type;
   an eighth semiconductor region provided on the first semiconductor region, the eighth semiconductor region surrounding the third semiconductor region, the sixth semiconductor region, and the seventh semiconductor region, the eighth semiconductor region being of the second conductivity type, the eighth semiconductor region including;
   a first region provided on the first portion of the first semiconductor region, a second region provided on the second portion of the first semiconductor region, and
   a third region provided on the third portion of the first semiconductor region, a distance between the third region of the eighth semiconductor region and the first electrode being larger than a distance between the first region of the eighth semiconductor region and the first electrode, the distance between the third region of the eighth semiconductor region and the first electrode being larger than a distance between the second region of the eighth semiconductor region and the first electrode; and
   a second electrode provided on the third, fourth, sixth, seventh, and eighth semiconductor regions, the second electrode being electrically connected to the third, fourth, sixth, seventh, and eighth semiconductor regions.

2. The device according to claim 1, wherein an impurity concentration of the second conductivity type in the third region of the eighth semiconductor region is lower than an impurity concentration of the second conductivity type in the first and second regions of the eighth semiconductor region.

3. The device according to claim 1, wherein
   the plurality of gate electrodes include a first gate electrode and a second gate electrode, the first gate electrode being provided between the second gate electrode and the seventh semiconductor region; and
   a distance between the first gate electrode and the first electrode is longer than a distance between the second gate electrode and the first electrode.

4. The device according to claim 3, further comprising a first conductive portion provided on the first semiconductor region, the first conductive portion being provided between the sixth and seventh semiconductor regions, the first conductive portion opposing the first, sixth, and seventh semiconductor regions with a first insulating layer interposed,
the first conductive portion being electrically connected to the second electrode.

5. The device according to claim 4, wherein
a distance between the first conductive portion and the first electrode is longer than a distance between each of the plurality gate electrodes and the first electrode.

6. The device according to claim 4, wherein
a distance between the first conductive portion and one of the plurality of gate electrodes adjacent to the first conductive portion is shorter than a distance between the adjacent gate electrodes of the plurality of gate electrodes.

7. The device according to claim 4, wherein
the plurality of gate electrodes includes first to third gate electrodes, the first gate electrode being adjacent to the second gate electrode, the second gate electrode being adjacent to the third gate electrode, the first gate electrode being provided between the third gate electrode and the first conductive portion; and
a distance between the first and second gate electrodes is shorter than a distance between the second and third gate electrodes.

8. The device according to claim 1, further comprising a plurality of ninth semiconductor regions of the first conductivity type provided on the first portion of the first semiconductor region, the plurality of ninth semiconductor regions including a first conductivity type impurity with a concentration higher than a concentration of a first conductivity type impurity in the first semiconductor region, wherein
the plurality of ninth semiconductor regions each are provided between the adjacent gate electrodes of the plurality of gate electrodes, the plurality of ninth semiconductor regions each being provided between the first portion of the first semiconductor region and the third semiconductor region;
the plurality of gate electrodes includes first to third gate electrodes, the first gate electrode being adjacent to the second gate electrode, the second gate electrode being adjacent to the third gate electrode, the first gate electrode being provided between the third gate electrode and the seventh semiconductor region, the seventh semiconductor region opposing the first gate electrode with the gate insulating layer interposed; and
the plurality of ninth semiconductor regions includes a first ninth semiconductor region between the first and second gate electrodes and a second ninth semiconductor region between the second and third gate electrodes, the first ninth semiconductor region having a first conductivity type impurity concentration lower than a first conductivity type impurity concentration in the second ninth semiconductor region.

9. The device according to claim 1, further comprising a first conductive portion provided on the first semiconductor region, the first conductive portion being provided between the sixth and seventh semiconductor regions, the first conductive portion opposing the first, sixth, and seventh semiconductor regions with a first insulating layer interposed,
the first conductive portion being electrically connected to the second electrode.

* * * * *